(12) United States Patent
Lin et al.

(10) Patent No.: US 8,536,003 B2
(45) Date of Patent: Sep. 17, 2013

(54) METHOD FOR FABRICATING SEMICONDUCTOR POWER DEVICE

(75) Inventors: Yung-Fa Lin, Hsinchu (TW); Shou-Yi Hsu, Hsinchu County (TW); Yi-Lin Sun, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 296 days.

(21) Appl. No.: 13/211,304

(22) Filed: Aug. 17, 2011

(65) Prior Publication Data
US 2012/0276726 A1 Nov. 1, 2012

(30) Foreign Application Priority Data

Apr. 29, 2011 (TW) .............................. 100115010 A (51) Int. Cl.
*H01L 21/8238* (2006.01)
(52) U.S. Cl.
USPC ........... 438/206; 438/137; 438/138; 438/156; 438/192; 257/E21.144; 257/E21.41
(58) Field of Classification Search
USPC ................. 438/137, 138, 156, 192, 206, 212, 438/268; 257/E21.144, E21.41
See application file for complete search history.

(56) References Cited

U.S. PATENT DOCUMENTS

| | | | | |
|---|---|---|---|---|
| 4,672,407 A * | 6/1987 | Nakagawa et al. | ........... | 257/142 |
| 5,273,917 A * | 12/1993 | Sakurai | .......................... | 438/138 |
| 6,479,352 B2 * | 11/2002 | Blanchard | ...................... | 438/268 |
| 6,660,571 B2 * | 12/2003 | Blanchard | ...................... | 438/138 |
| 7,378,320 B2 * | 5/2008 | Seo et al. | ........................ | 438/286 |
| 8,314,002 B2 * | 11/2012 | Francis et al. | ................. | 438/370 |
| 8,404,531 B2 * | 3/2013 | Lin et al. | ........................ | 438/192 |
| 2001/0025973 A1 * | 10/2001 | Yamada et al. | ................ | 257/296 |
| 2002/0197782 A1 * | 12/2002 | Kitamura | ........................ | 438/200 |
| 2005/0133836 A1 * | 6/2005 | Seo et al. | ........................ | 257/288 |
| 2005/0153527 A1 * | 7/2005 | Kitamura | ....................... | 438/514 |
| 2012/0199903 A1 * | 8/2012 | Lin et al. | ........................ | 257/335 |
| 2012/0252176 A1 * | 10/2012 | Lin et al. | ........................ | 438/197 |
| 2012/0276726 A1 * | 11/2012 | Lin et al. | ........................ | 438/561 |
| 2013/0119460 A1 * | 5/2013 | Lin et al. | ........................ | 257/330 |
| 2013/0134478 A1 * | 5/2013 | Nakajima et al. | ............. | 257/139 |

* cited by examiner

*Primary Examiner* — Jarrett Stark
(74) *Attorney, Agent, or Firm* — Winston Hsu; Scott Margo (57) ABSTRACT

A method for fabricating a semiconductor power device includes the following steps. First, a substrate having thereon at least a semiconductor layer and a pad layer is provided. Then, at least a trench is etched into the pad layer and the semiconductor layer followed by depositing a dopant source layer in the trench and on the pad layer. A process is carried out thermally driving in dopants of the dopant source layer into the semiconductor layer. A rapid thermal process is performed to mend defects in the dopant source layer and defects between the dopant source layer and the semiconductor layer. Finally, a polishing process is performed to remove the dopant source layer from a surface of the pad layer.

11 Claims, 10 Drawing Sheets

METHOD FOR FABRICATING SEMICONDUCTOR POWER DEVICE

BACKGROUND OF THE INVENTION

1. Field of the Invention

This present invention generally relates to the field of semiconductor power devices. More particularly, the present invention relates to a method for mending lattice defects in a power MOSFET with a super-junction.

2. Description of the Prior Art

A power device is mainly used in power management; for instance, in a switching power supply, a management integrated circuit in the core or a peripheral region of computer, a backlight power supply, and in an electric motor control. The type of power devices described above include an insulated gate bipolar transistor (IGBT), a metal-oxide-semiconductor field effect transistor (MOSFET), and a bipolar junction transistor (BJT), among which the MOSFET is the most widely applied because of its energy saving properties and ability to provide faster switch speed.

In one kind of power device, a P-type epitaxial layer and an N-type epitaxial layer are alternatively disposed to form several PN junctions inside a body, wherein the junctions are vertical to a surface of the body. A structure with the described PN junctions is also called a super-junction structure. In a conventional method for fabricating the super-junction structure, an epitaxial layer of a first conductivity type, e.g. N-type, is formed on a substrate of the first conductivity type. Then, a plurality of trenches is etched into the first conductivity type epitaxial layer by a first mask. A second conductivity type epitaxial layer, e.g. P-type epitaxial layer, is filled into the trenches and the surface of the second conductivity type epitaxial layer is made level with the surface of the first conductivity type epitaxial layer. Hence, the trenches are filled with the second conductivity type epitaxial layer and are surrounded by the first conductivity type epitaxial layer. As a result, a super-junction structure with a plurality of PN junctions is formed.

The above-mentioned method has many drawbacks, however. For instance, defects, such as seam defects, void defects and lattice dislocation, often form inside the second conductivity type epitaxial layer during the fabrication process. As a result, the defects reduce the yield and conductivity of the device. In light of the above, there is still a need for fabricating a semiconductor power device with fewer lattice defects, which are capable of overcoming the shortcomings and deficiencies of the prior art and further increasing the yield of the device.

SUMMARY OF THE INVENTION

To address these and other objectives, the present invention provides a method for fabricating a semiconductor power device. First, a substrate having at least a semiconductor layer and a pad layer thereon is provided. At least a trench is etched into the pad layer and the semiconductor layer followed by depositing a dopant source layer in the trench and on the pad layer. A process is carried out which thermally drives in dopants of the dopant source layer into the semiconductor layer. A rapid thermal process is performed to mend defects in the dopant source layer and defects between the dopant source layer and the semiconductor layer. Finally, a polishing process is performed to remove the dopant source layer from a surface of the pad layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Please refer to FIGS. 1-10, which are schematic diagrams illustrating a method for fabricating a semiconductor power device in accordance with the embodiment of the present invention, wherein a planar type power device is an exemplary embodiment suitable for the present invention.

Figure 1:
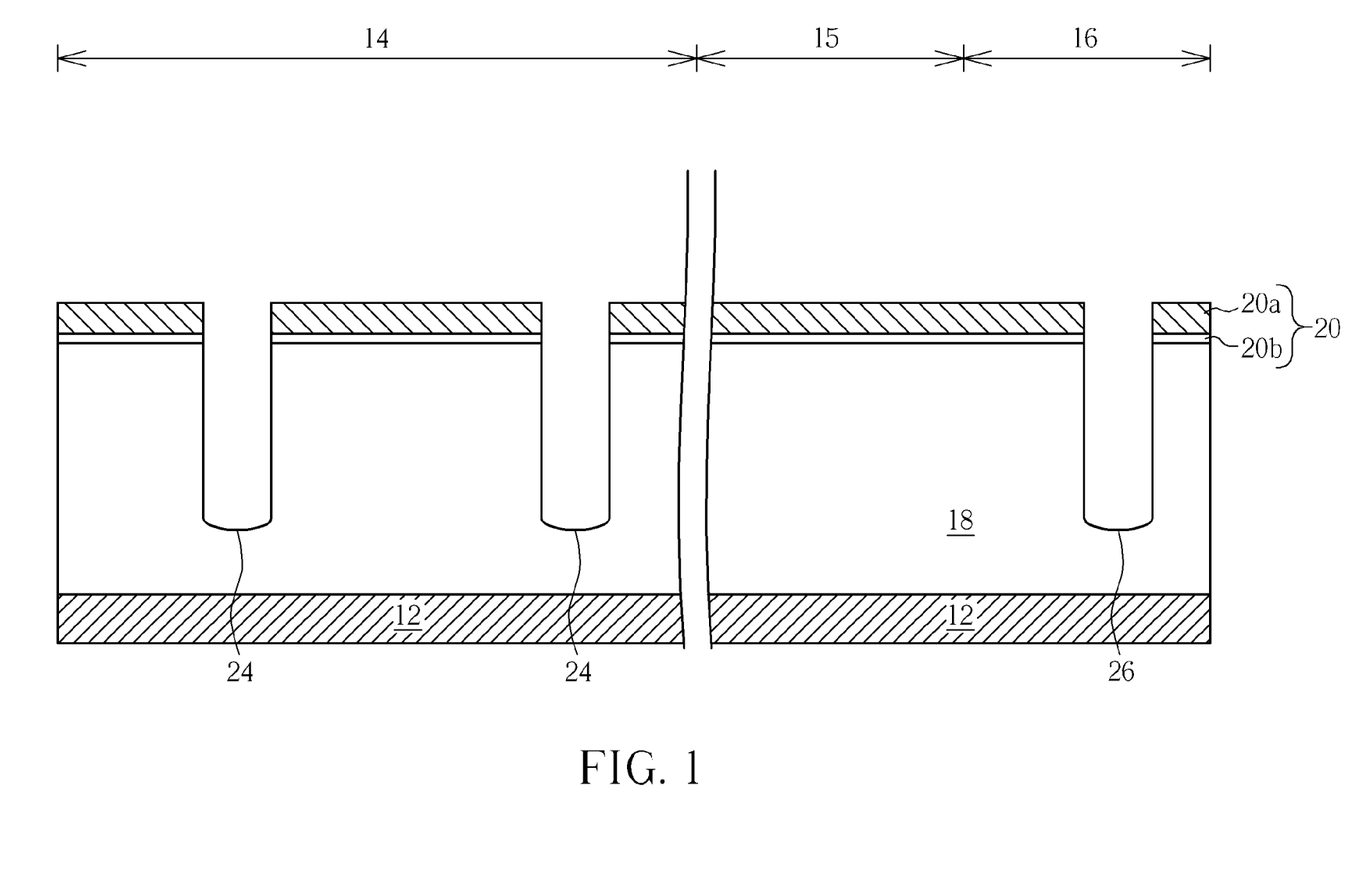
FIGS. 1-10 are schematic, cross-sectional diagrams illustrating a method for fabricating a semiconductor power device in accordance with one embodiment of this invention.

As shown in FIG. 1, in a preferred embodiment of this invention, a substrate 12 of a first conductivity type is provided which is an N$^+$ silicon substrate and functions as a drain electrode of the semiconductor device. A cell region 14, termination region 16 surrounding the cell region 14, and a transition region 15 disposed between the cell region 14 and the termination region 16 are defined in the substrate 12. The cell region 14 is used to accommodate a semiconductor device while the termination region 16 comprises a voltage sustaining structure which can function as a barrier for preventing the spreading of the high intensity electric field generated from the cell region 14. Then, an epitaxial layer 18 of the first conductivity type is disposed on the substrate 12 through an epitaxial process. According to the embodiment of the invention, the epitaxial layer 18 of the first conductivity type can be an epitaxial layer doped with N$^-$, for example, the epitaxial layer 18 of the first conductivity type can be formed by a CVD process or any other proper methods and the epitaxial layer 18 of the first conductivity type can function as a drift layer in the power device. A pad layer 20 which can be divided into two parts is formed on the epitaxial layer 18 of the first conductivity type. The composition of an upper pad layer 20a may be Si$_3$N$_4$ and the composition of a lower pad layer 20b may be SiO$_2$.

Still referring to FIG. 1, a photolithography and etching process is carried out to etch a plurality of trenches 24, 26 into the pad layer 20 and epitaxial layer 18 in sequence while the trenches 24, 26 are disposed in the cell region 14, and the termination region 16, respectively. Depending on different engineering demands, the formation of the trenches 24, 26 can be in the following sequences: a photoresist layer (not shown) coated on the pad layer 20 is treated with a photolithography process in order to define the location of the trenches; an anisotropic etching process, which uses a patterned photoresist as an etching mask, is performed to transfer the pattern of the patterned photoresist into the pad layer 20. The removal of the patterned photoresist is performed followed by a dry etching process, thereby further transferring the pattern into the epitaxial layer 18. The above mentioned method for forming the trenches is only exemplary and the trenches 24, 26 can be fabricated by other methods. In addition, the shape, location, width, depth, length, and number of the trenches are not limited to the trenches 24, 26 shown in FIG. 2. The trenches 24, 26 could be modified for design purposes or manufacturing demands; for instance, the layout of the trenches 24, 26 can be in the form of strips, hexagons, or a spiral-pattern.

Figure 2:
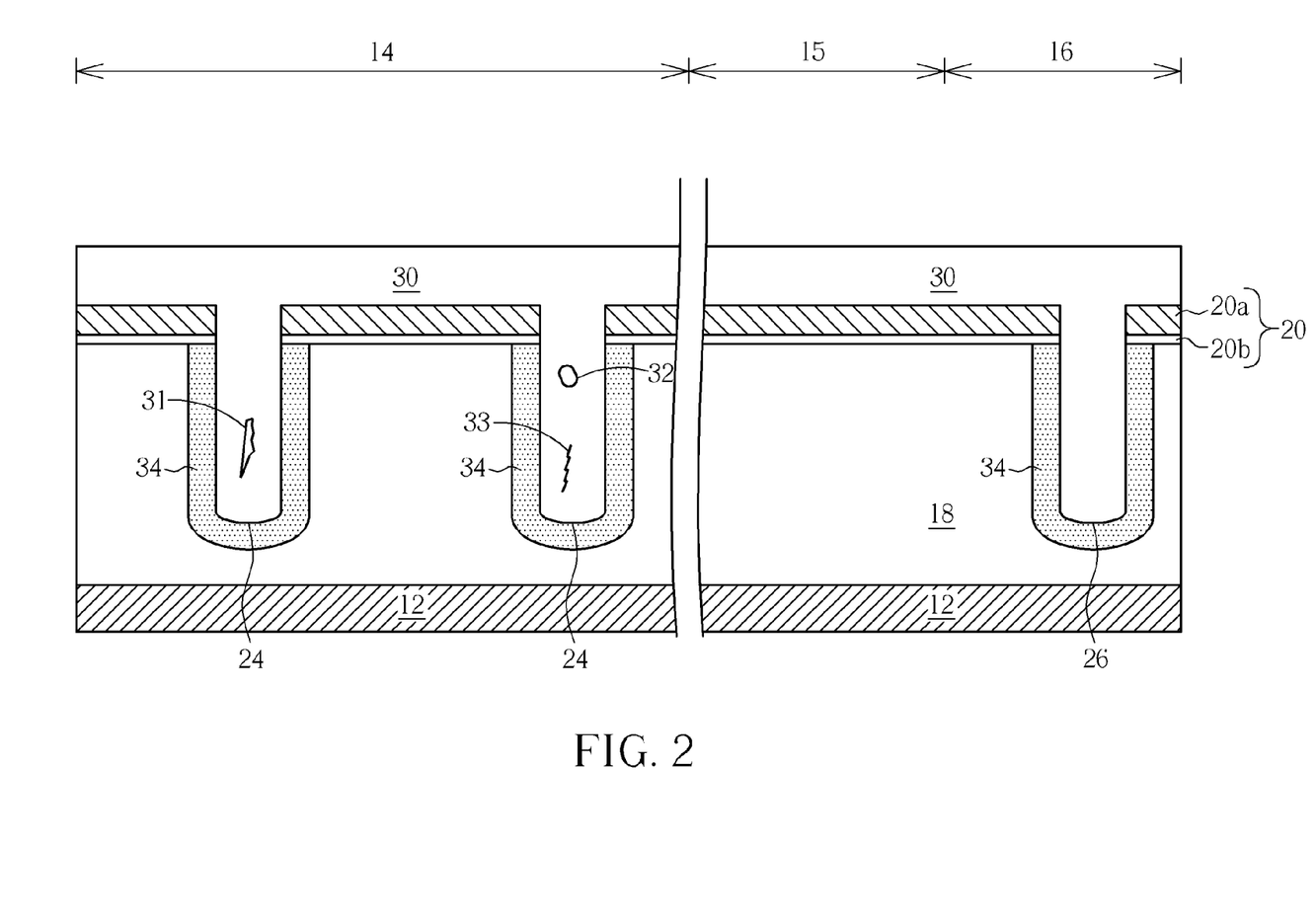

As shown in FIG. 2, a dopant source layer 30 which has the second conductivity type, e.g. P-type, is disposed on the surface of the pad layer 20 and fills up the trenches 24, 26. The composition of the dopant source layer 30 includes epitaxial silicon, polysilicon or amorphous solicon, but is not limited thereto. A thermal drive-in process is performed to diffuse dopants, e.g. boron, inside the dopant source layer 30 into the epitaxial layer 18. Therefore, a body diffusion region 34 with second conductivity type is formed surrounding the trenches 24, 26 in the epitaxial layer 18. As a consequence, a plurality of vertical PN junctions is formed in the epitaxial layer 18, the structure of which is called a super junction.

According to limits in the prior art, the above-mentioned conventional process has certain drawbacks. For instance, defects, e.g. seam defects 31, void defects 32 and lattice discolation 33, exist inside the dopant source layer 30 and on the interface of the dopant source layer 30 and the semiconductor layer. As a result, the defects reduce the yield and conductivity of the device. The present invention therefore provides a rapid thermal treatment with radiation from the front side of the device in order to mend defects inside the dopant source region 30. The temperature of the rapid thermal treatment ranges from 1200° C. to 1800° C. and the rapid thermal treatment includes spike thermal annealing, laser thermal annealing, LTA, or laser spike annealing, LSA, but is not limited thereto. It is worth noting that the defects 31, 32, 33 inside the dopant source region 30 can be eliminated or reduced through the rapid thermal treatment and therefore the yield rate of the semiconductor power device is ramped up.

Figure 3:
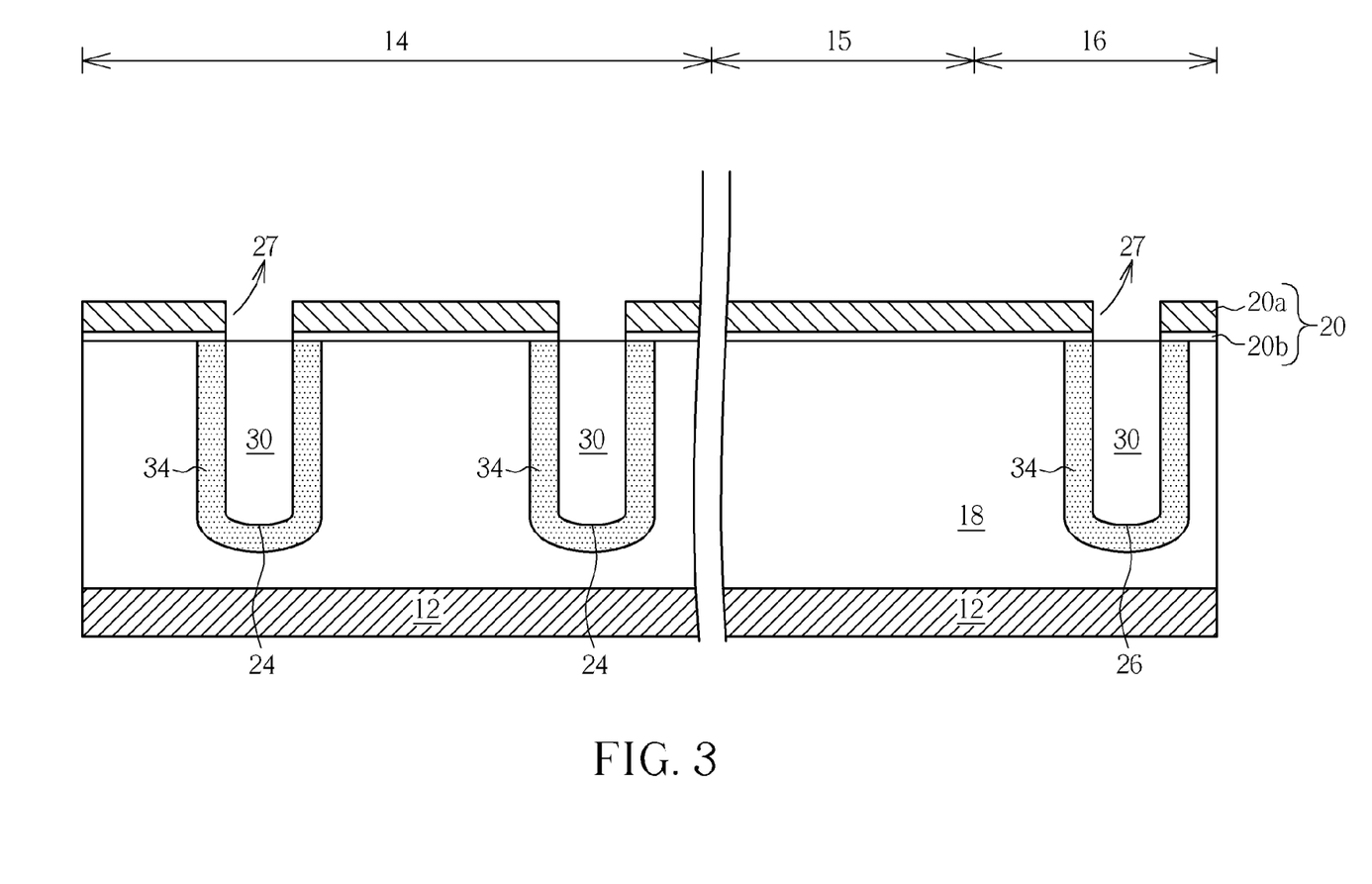

As depicted in FIG. 3, a CMP process is carried out to remove the dopant source layer 30 (not shown) until the top surface of the pad layer 20 is exposed. Then, an etching back process is performed to etch away a portion of the dopant source layer 30 in the trenches 24, 26, which can expose the upper portion of the trenches 24, 26. A plurality of recessed structures 27 is thereby formed. At this time, the top surface of the dopant source layer 30 in the trenches 24, 26 is approximately level with the top surface of the semiconductor layer 18.

Figure 4:
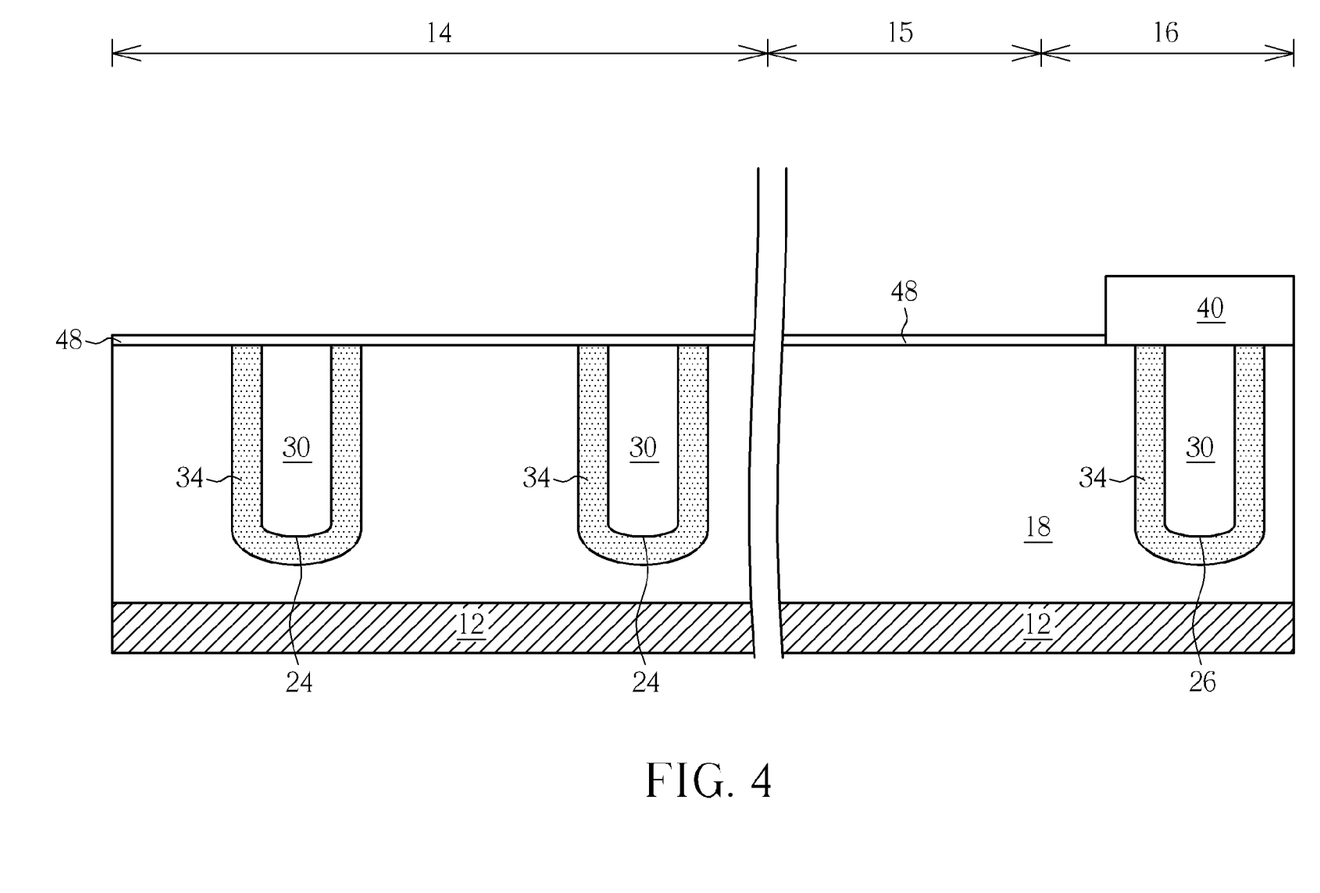
Figure 5:
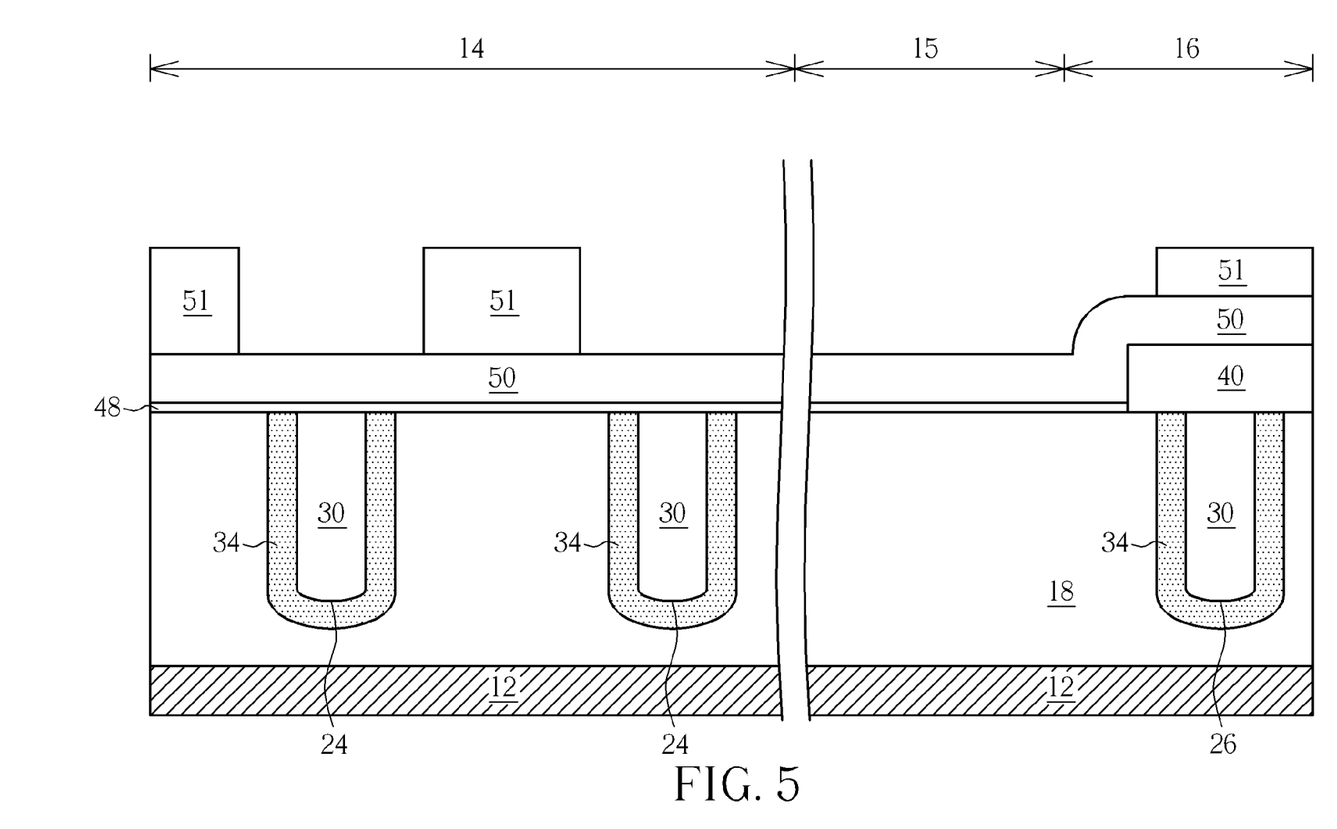

As illustrated in FIG. 4, the pad layer 20 (not shown) is removed to expose the semiconductor layer 18. A field oxide layer 48 is formed on the surface of the epitaxial layer 18 within the cell region 14 and the transition region 15. Then, a field oxide layer 40 is formed above the trench 26 within the termination region 16. The above mentioned field oxide layers 40, 48 include silicon oxide As shown in FIG. 5, a gate conducting layer 50 is formed. According to the preferred embodiment of the invention, the gate conducting layer 50 may comprise doped polysilicon. A photolithography process is performed to form a patterned photoresist 51, which comprises a plurality of openings 51a exposing a portion of the gate conducting layer 50. The patterned photoresist 51 can be used to transfer patterns into the gate conducting layer 50 via an additional process.

Figure 6:
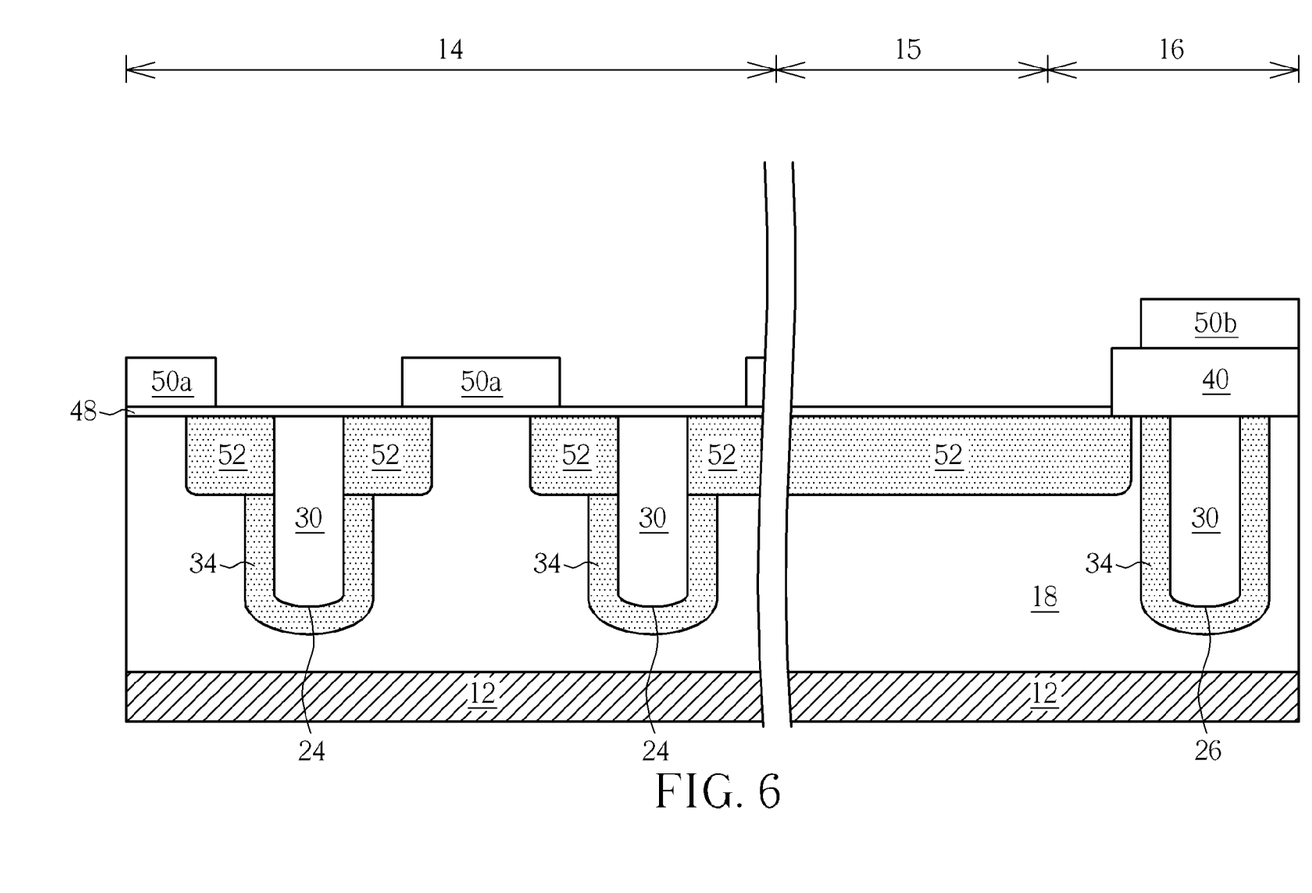

As demonstrated in FIG. 6, by performing an etching process, a part of the gate conducting layer 50 can be etched away through the opening 51a (not shown) to form gate pattern 50a, 50b while the gate pattern 50a and the gate pattern 50b are disposed above the gate oxide layer 48 and the field oxide layer 40, respectively. After the process described above, the patterned photoresist 51 is removed. A self-aligned ion implantation process is performed to form a plurality of ion wells 52 with the second conductivity type, e.g. P-type well, while each ion wells 52 in the epitaxial layer 18 is beside the trenches 24, 26. Finally, a drive-in process can further be carried out to activate dopants inside each of the ion wells 52.

Figure 7:
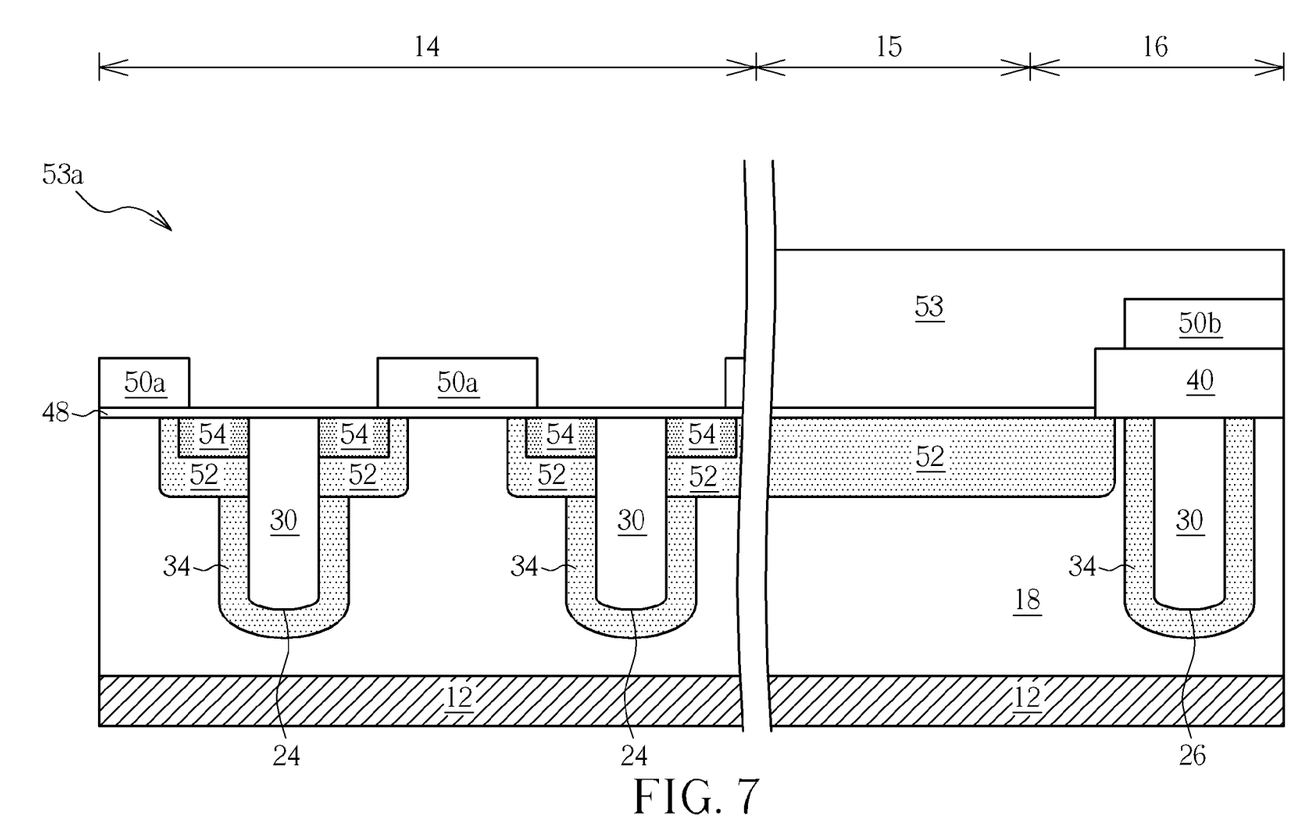

As shown in FIG. 7, a photoresist layer 53 including an opening 53a is formed to expose the cell region 14 by a photolithography process. Another ion implantation process is performed to form a source doping region 54 of the first conductivity type in the ion wells 52 within the cell region 14. During the ion implantation process, no doping region is formed within the transition region 15 and the termination region 16 that are covered by the photoresist layer 53. The photoresist layer 53 is removed and a drive-in process is performed to activate dopants in the source doping region 54.

Figure 8:
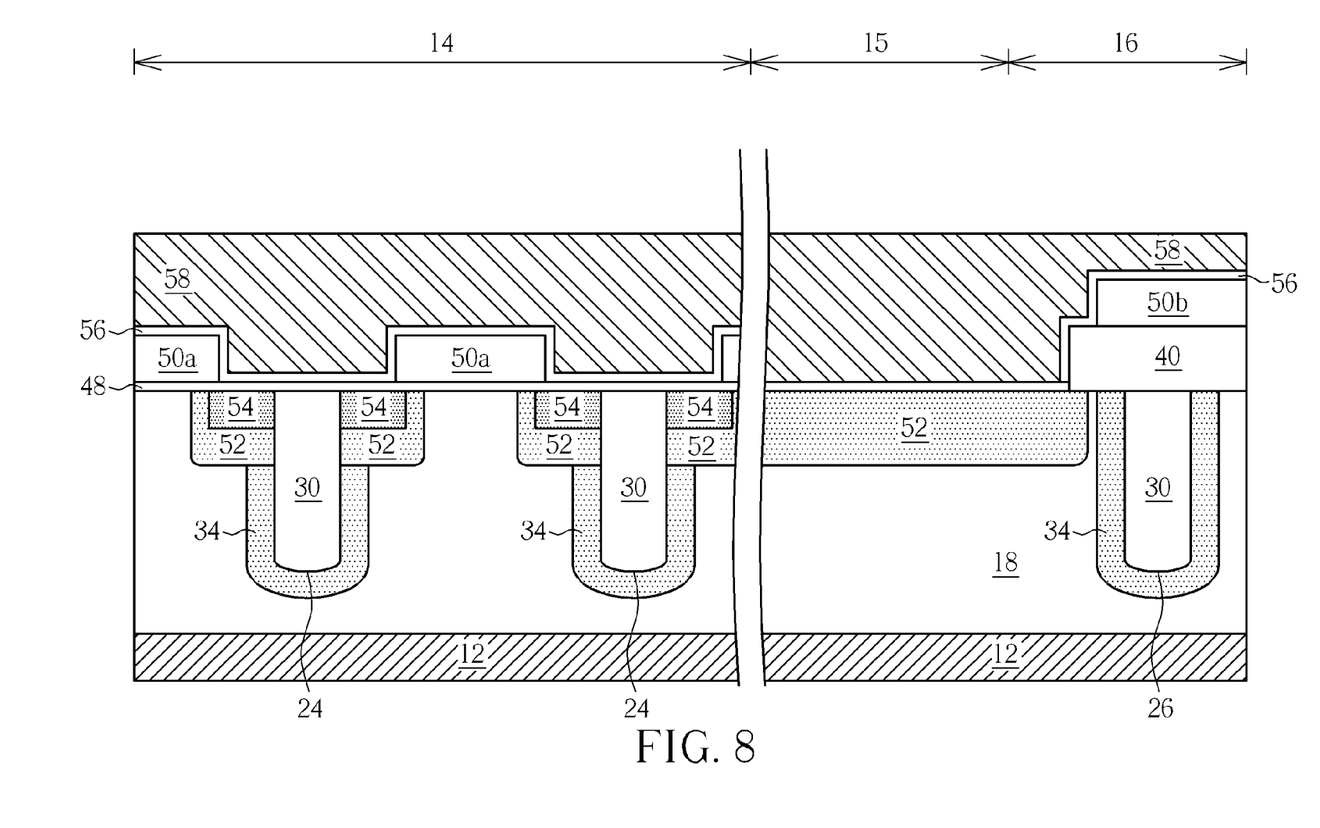

As shown in FIG. 8, a liner 56 and a dielectric layer 58 are disposed sequentially on the surface of the cell region 14 and termination region 16. According to the preferred embodiment of the invention, the dielectric layer 58 may comprise BPSG. A reflow and/or etching back process may be applied to planarize the surface of the second dielectric layer 58.

Figure 9:
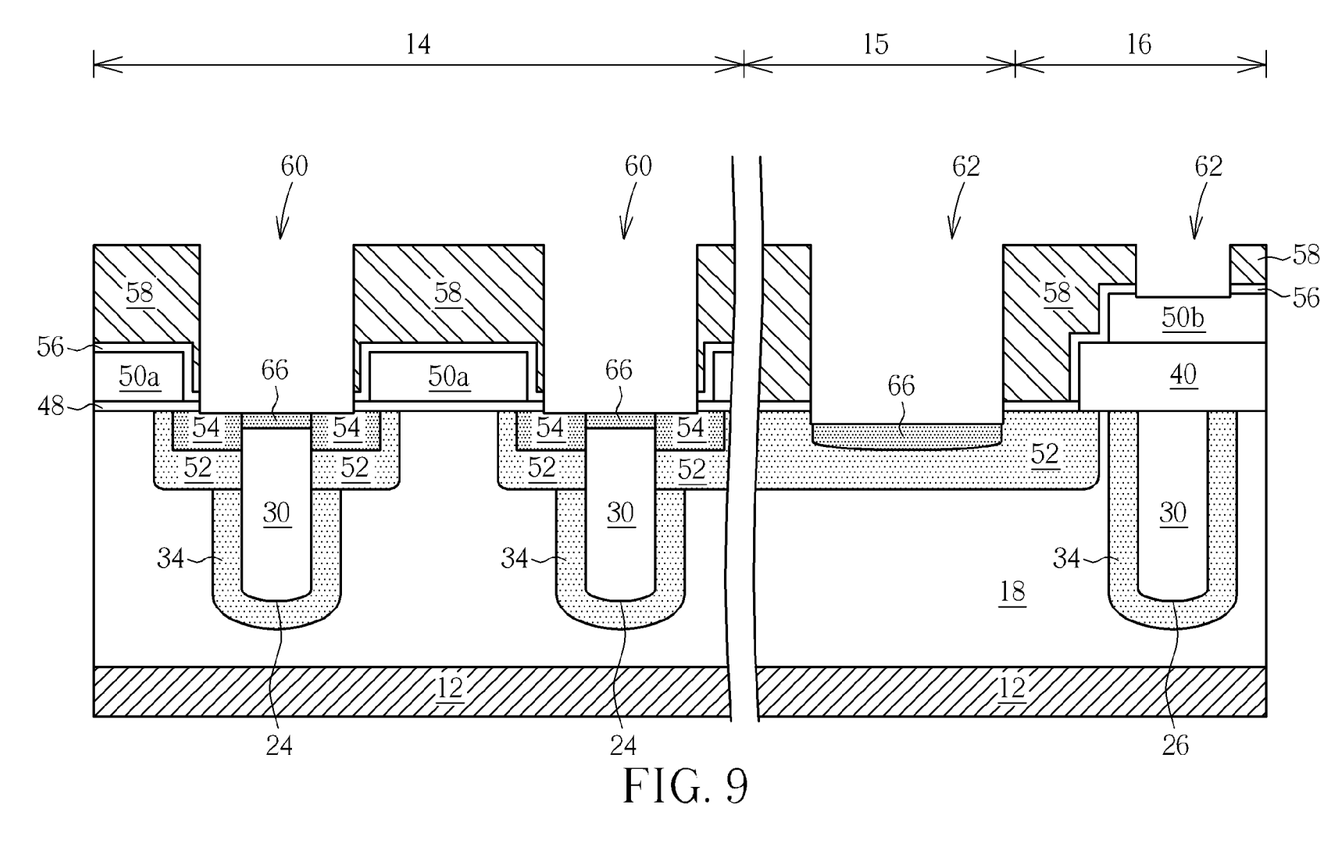

Please refer to FIG. 9. By performing a photolithography and an etching process, a portion of the dielectric layer 58 and a portion of the liner 56, which are within the cell region 14, are etched away to form a contact opening 60 which corresponds to each trench 24 in the cell region 14. Therefore, the surface of the dopant source layer 30 inside the trenches 24 and a portion of the source doping region 54 are exposed. At the same time, a contact opening 62 is formed to expose the ion well 52 and the gate pattern 50b within the transition region 15 and the termination region 16, respectively. Then, a doping region 66 of the second conductivity type is formed under the surface of the dopant source region 30 via an ion implantation. At the same time, a doping region 66 of the second conductivity type is also formed under the surface of a portion of the ion well 52. Through the above mentioned ion implantation process, the conductivity on the interface of the semiconductor and the metal contact formed in the following process is improved.

Figure 10:
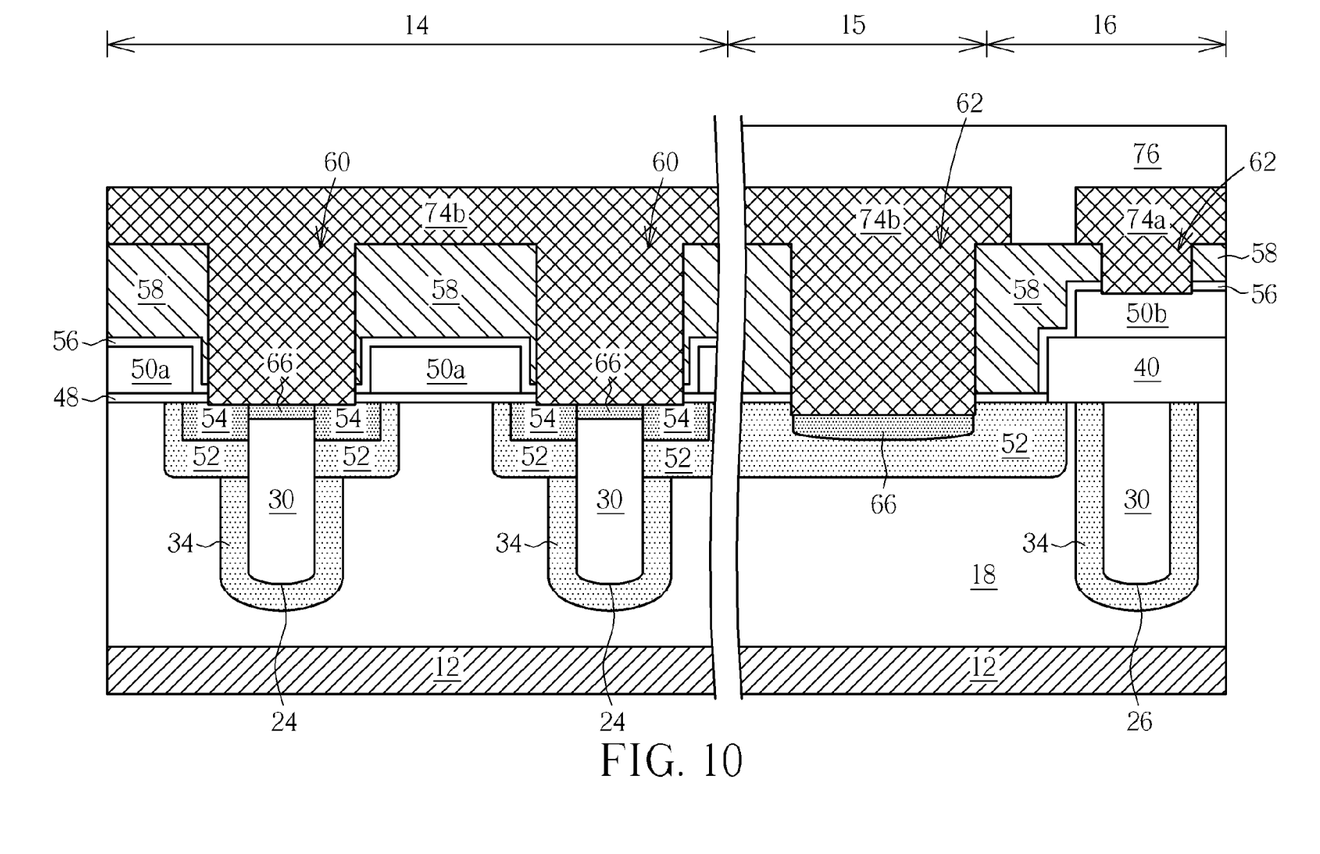

As demonstrated in FIG. 10, a conductive layer (not shown) which may comprise metal, e.g. titanium, aluminum, but is not limited thereto, covers the dielectric layer 58 and fills up the contact opening 60, 62. In another embodiment of the invention, a glue layer and/or a barrier layer may be formed before the filling of the metal layer. Another photolithography process is then performed to remove a portion of the conductive layer (not shown) within the termination region 16, thereby forming at least a gate wire 74a and at least a source wire 74b. The gate wire 74a directly contacts the surface of the gate pattern 50b while the source wire 74b directly contacts and covers the dielectric layer 58 and a portion of the semiconductor layer 18 within the cell region 14 and the transition region 15. Then, a protecting layer 76, covering the gate wire 74a but exposing the source wire 74b, is formed within the transition region 15 and the termination region 16. As a result, the power device of the present invention is formed.

To summarize, the present invention provides a rapid thermal processing, RTP, which can be used to mend defects in the epitaxial layer and further increase the yield rate of the semiconductor power device.

Those skilled in the art will readily observe that numerous modifications and alterations of the device and method may be made while retaining the teachings of the invention.

What is claimed is:

1. A method for fabricating a semiconductor power device, comprising:
   providing a substrate having thereon at least a semiconductor layer and a pad layer;
   etching at least a trench into the pad layer and the semiconductor layer;
   depositing a dopant source layer in the trench and on the pad layer;
   thermally driving in dopants of the dopant source layer into the semiconductor layer;
   performing a rapid thermal process to mend defects in the dopant source layer and defects on the interface between the dopant source layer and the semiconductor layer; and
   performing a polishing process to remove the dopant source layer from a surface of the pad layer.

2. The method for fabricating a semiconductor power device according to claim 1 wherein after performing the polishing process, the method further comprises:
   removing the pad layer to expose the semiconductor layer.

3. The method for fabricating a semiconductor power device according to claim 1 wherein the polishing process is chemical mechanical polishing process.

4. The method for fabricating a semiconductor power device according to claim 1 wherein the rapid thermal process is carried out at a temperature ranging between 1200° C. and 1800° C. and the radiation of the rapid thermal process is a front side radiation.

5. The method for fabricating a semiconductor power device according to claim 1 wherein the substrate and the semiconductor layer both have a first conductivity type.

6. The method for fabricating a semiconductor power device according to claim 5 wherein the first conductivity type is N type.

7. The method for fabricating a semiconductor power device according to claim 6 wherein the dopant source layer has a second conductivity type.

8. The method for fabricating a semiconductor power device according to claim 7 wherein the second conductivity type is P type.

9. The method for fabricating a semiconductor power device according to claim 1 wherein the dopant source layer comprises epitaxial silicon, polysilicon or amorphous silicon.

10. The method for fabricating a semiconductor power device according to claim 1 wherein the dopants comprise phosphorus.

11. The method for fabricating a semiconductor power device according to claim 1 wherein the pad layer comprises silicon nitride or silicon oxide.

* * * * *